United States Patent
Vanderberg et al.

(10) Patent No.: US 8,502,173 B2
(45) Date of Patent: Aug. 6, 2013

(54) SYSTEM AND METHOD FOR ION IMPLANTATION WITH IMPROVED PRODUCTIVITY AND UNIFORMITY

(71) Applicant: Axcelis Technologies Inc., Beverly, MA (US)

(72) Inventors: Bo H. Vanderberg, Gloucester, MA (US); Steven C. Hays, Rowley, MA (US); Andy Ray, Newburyport, MA (US)

(73) Assignee: Axcelis Technologies Inc., Beverly, MA (US)

( * ) Notice: Subject to any disclaimer, the term of this patent is extended or adjusted under 35 U.S.C. 154(b) by 0 days.

(21) Appl. No.: 13/625,277

(22) Filed: Sep. 24, 2012

(65) Prior Publication Data

US 2013/0026356 A1   Jan. 31, 2013

Related U.S. Application Data

(63) Continuation of application No. 12/796,215, filed on Jun. 8, 2010, now Pat. No. 8,278,634.

(60) Provisional application No. 61/185,109, filed on Jun. 8, 2009.

(51) Int. Cl.
   *H01J 37/317*   (2006.01)
(52) U.S. Cl.
   CPC .................................. *H01J 37/317* (2013.01)
   USPC ..................................... 250/492.21; 250/251
(58) Field of Classification Search
   USPC ............................ 250/492.21, 251
   See application file for complete search history.

(56) References Cited

U.S. PATENT DOCUMENTS

| | | | |
|---|---|---|---|
| 5,481,116 A | 1/1996 | Glavish et al. | |
| 5,672,879 A | 9/1997 | Glavish | |
| 6,329,650 B1 | 12/2001 | Dudnikov | |
| 7,276,711 B2 * | 10/2007 | Kawaguchi et al. | 250/492.21 |
| 7,442,944 B2 | 10/2008 | Chang et al. | |
| 7,544,958 B2 | 6/2009 | Low | |
| 7,755,067 B2 | 7/2010 | Tsukihara et al. | |
| 2007/0075259 A1 | 4/2007 | Fujita | |
| 2008/0173828 A1 | 7/2008 | Ohno et al. | |
| 2010/0308215 A1 | 12/2010 | Vanderberg | |

OTHER PUBLICATIONS

Office Action dated Feb. 3, 2012 to U.S. Appl. No. 12/796,215.
Notice of Allowance dated Jun. 26, 2012 to U.S. Appl. No. 12/796,215.

* cited by examiner

*Primary Examiner* — Kiet T Nguyen
(74) *Attorney, Agent, or Firm* — Eschweiler & Associates, LLC (57) ABSTRACT

A method comprising introducing an injected gas (e.g., Argon, Xenon) into a beam line region comprising a magnetic scanner is provided herein. The injected gas improves beam current by enhancing (e.g., increasing, decreasing) charge neutralization of the magnetic ion beam (e.g., the ion beam at regions where the scanning magnetic field is non-zero) thereby reducing the current loss due to the zero field effect (ZFE). By reducing the current loss in regions having a magnetic field, the magnetic beam current is increased (e.g., the beam current is increased in regions where the magnetic field is non-zero) raising the overall beam current in a uniform manner over an entire scan path and thereby reducing the effect of the ZFE. In other words, the ZFE is removed by effectively minimizing it through an increase in the magnetized beam current.

38 Claims, 9 Drawing Sheets

SYSTEM AND METHOD FOR ION IMPLANTATION WITH IMPROVED PRODUCTIVITY AND UNIFORMITY

CROSS REFERENCE TO RELATED APPLICATIONS

This application is a Continuation of U.S. patent application Ser. No. 12/796,215 filed on Jun. 8, 2010 in the name of Bo Vanderberg, et al. entitled "System and Method for Ion Implantation with Improved Productivity and Uniformity", which is a non-provisional of U.S. Provisional patent application Ser. No. 61/185,109 and is hereby incorporated by reference.

FIELD

The present invention relates generally to ion implantation systems, and more specifically to methods and apparatus for improving productivity and uniformity of a magnetically scanned ion beam.

BACKGROUND

In the manufacture of semiconductor devices, ion implantation is often used to dope semiconductor workpieces (e.g., silicon wafers) with impurities. For example, ion implanters or ion implantation systems may treat a workpiece with an ion beam, to produce n-type or p-type doped regions or to form passivation layers on the workpiece. When used for doping semiconductors, the ion implantation system injects a selected ion species to produce the desired extrinsic material.

Since the size of a workpiece is often greater than the size of an ion beam, hybrid scan ion implanters are often employed to enable an ion beam to scan over a surface of a workpiece. Hybrid scan ion implanters rely upon a time varying electric or magnetic field to scan a beam (e.g., a pencil beam) back and forth over a scan path (e.g., into a ribbon beam), thereby effectively spreading out a beam, while moving a workpiece in an orthogonal direction. This hybrid scanning therefore allows an ion beam to be scanned over the entire surface of a workpiece.

In general, it is desirable to provide high wafer throughput by maximizing the beam current of an ion beam. To produce and transport an ion beam efficiently through a beam line it is desirable to have a beam comprising an overall charge neutrality (e.g., to form an ion beam plasma having a substantially equal density of both positively charged and negatively charged particles). Charge neutrality helps to prevent beam blow up (e.g., the tendency of the like charged ions comprising a beam to repel each other, thereby causing the beam to diverge away from its intended path), which can cause beam loss.

In general, it is also desirable to provide uniform implantation of the workpiece. Beam blowup, occurring differently along different paths through the beam line, may cause a change of ion beam properties, such as current or size, across the scan path. If these non-uniformities are not corrected the workpiece may be implanted non-uniformly and wafer yield (i.e. the ratio of wafer area implanted with desired properties to total wafer area) may suffer.

SUMMARY

The present invention is directed to an ion implantation system configured to reduce the effect of zero field effects (ZFE) (e.g., thereby increasing beam uniformity) while increasing overall productivity. One particular aspect of the invention provides a method comprising introducing a neutralizing injected gas (e.g., Argon, Xenon) into a beam line to primarily affect a region comprising a magnetic scanner. More particularly, an injected gas is introduced into a beam line, raising the pressure of an ambient vacuum around the magnetic scanner, to enhance (e.g., increase) the beam current (e.g., increase the neutralization) or density of the magnetized ion beam (e.g., an ion beam at regions where the scanning magnetic field is non-zero) thereby providing a uniform beam current. The injected gas may improve beam current or density by enhancing (e.g., increasing, decreasing) charge neutralization of the magnetized beam (e.g., the ion beam at regions where the scanning magnetic field is non-zero) thereby reducing the current loss due to the ZFE (e.g., through charge neutralization). By reducing the current loss in regions having a magnetic field, the magnetized beam current or density is enhanced (e.g., the beam current or density is increased in regions where the magnetic field is non-zero) raising the overall beam current in a uniform manner over an entire scan path and thereby reducing the effect of the ZFE. In other words, the ZFE is effectively mitigated by an increase in the magnetized beam current or density.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

The present invention will now be described with reference to the drawings wherein like reference numerals are used to refer to like elements throughout.

Ion implanters (e.g., hybrid scan ion implanters) may rely upon magnetic scanners to effectively scan an ion beam over the surface of a workpiece. Magnetic scanners in particular have been found to cause a detrimental time-dependent space charge effect on ion beams often referred to as the zero field effect (ZFE) or the zero field anomaly (ZFA). The zero field effect relates to a sudden change (e.g., drop, rise) in beam current when the magnitude of a scanning magnetic field approaches zero. If the beam scan velocity cannot be modulated sufficiently fast, or if the beam shape change causes the part of the workpiece that is implanted by the beam suffering the ZFE to be implanted differently, the implant can result with detrimental non-uniformity on a workpiece.

The exact cause of the zero field effect is not clear, however it likely has to do with beam neutralization (e.g., the transport enhancement that is received when there is a neutralizing agent in a beam line, such as a neutralizing beam plasma generated via collisions of beam ions with the neutral background gas) and may be the result of the magnetic field, or the induced electric field (e.g., due to the time varying magnetic field), forcing neutralizing electrons out of the beam line area (e.g., the magnetic or induced electric field acts upon the electrons with a force that pushed them out of the beam line) and thereby reducing charge neutrality and leading to transport enhancement or reduction (e.g., providing more or less beam current depending on how charge neutralization effects beam transport). However, regardless of the cause of ZFE, the result of the zero field effect is an uneven beam current profile that may result in a non-uniform implant on the workpiece.

Accordingly, a method for reducing the zero field effect and improving productivity and uniformity of a magnetically scanned beam is provided herein. More particularly, a gas is introduced into a beam line to affect a beam passing through a magnetic scanner element of an ion implanter. The gas reduces the effect of ZFE by enhancing the neutralization (or lack thereof) of a magnetized beam (e.g., of a beam that is exposed to a non-zero magnetic field) providing an improved beam current or density of magnetized beams not affected by ZFE and resulting in an overall uniform beam current over a scan path.

In one embodiment, an injected gas (e.g., Argon, Xenon) is introduced into a beam line to primarily affect an ion beam passing through a beam line region. In one particular embodiment, the beam line region comprises a magnetic scanner configured to scan an ion beam along a scan path. The injected gas is introduced into a beam line, raising the pressure of the ambient vacuum around the magnetic scanner, and thereby improving beam current or density by enhancing (e.g., increasing or reducing) charge neutralization of the magnetic beam (e.g., the ion beam at regions where the scanning magnetic field is non-zero). By reducing the current loss due to zero field effect (ZFE), the magnetic beam current and/or density is enhanced (e.g., the beam current and/or density is increased in regions where the magnetic field is non-zero) providing for a uniform beam current and/or density (e.g., by increasing the magnetized beam current and/or density) in a uniform manner over the scan path (e.g., the surface of the workpiece) and thereby reducing the effect of ZFE on the beam current or density. In other words, the ZFE is effectively mitigated by an increase in the magnetized beam current or density.

While in one embodiment the gas is injected into the magnetic scanner it should be understood that such gas may be introduced into a region proximate to the scanner region or in any portion of the ion implantation system, and such variations are contemplated as falling within the scope of the present invention.

In a more particular embodiment, the beam current and/or density can be compared at multiple positions along the scan path. The gas pressure of the magnetic scanner can be tuned by incrementally introducing the injected gas to minimize the difference between the beam current and/or density measure at the multiple scan positions. In an alternative embodiment, the beam can be measured at a single position along the scan path and an injected gas can be introduced (e.g., an injected gas flow can be varied) to achieve some desired change in the beam current and/or density at this single position. This embodiment effectively tunes the injected gas flow (e.g., during a calibration of the beam line) for a desired beam current and/or density change or value based on some prior knowledge of what is required rather than directly measuring the differences in beam current and/or density. For example, a magnetic field may be applied to an ion beam comprised within a magnetic scanner, causing the ion beam to move off center to a fixed position for a period of time. The beam current can then be measured and adjusted while the magnetic field keeps the beam at that location. Such an embodiment may allow for faster measurement times and improved performance of the tuning.

In another embodiment, an injected gas is incrementally injected into a beam line to affect a beam passing through a magnetic scanning element and to enhance (e.g., optimize) beam current or density of a magnetized ion beam to a level that effectively minimizes the effect of ZFE. In such an embodiment, a beam current or density is measured (e.g., by a profiler and/or a faraday cup) over a scan path to determine a ZFE and is iteratively tuned in a manner such that the injected gas is incrementally introduced in response to the detection of ZFE. The beam current will typically increase due to an increased amount of injected gas in the magnetic scanning element, however it will be appreciated that the beam current may also decrease due to the additional injected gas (e.g., if too much injected gas is added to the magnetic scanning element). Therefore, as provided herein, injected gas may be added until a desired uniformity of beam current is achieved. Therefore, through an iterative process of measurement and incremental introduction of the injected gas, the beam current or density of a magnetized beam can be tuned in a manner which optimizes beam neutralization and reduces the effect of ZFE.

Figure 1:
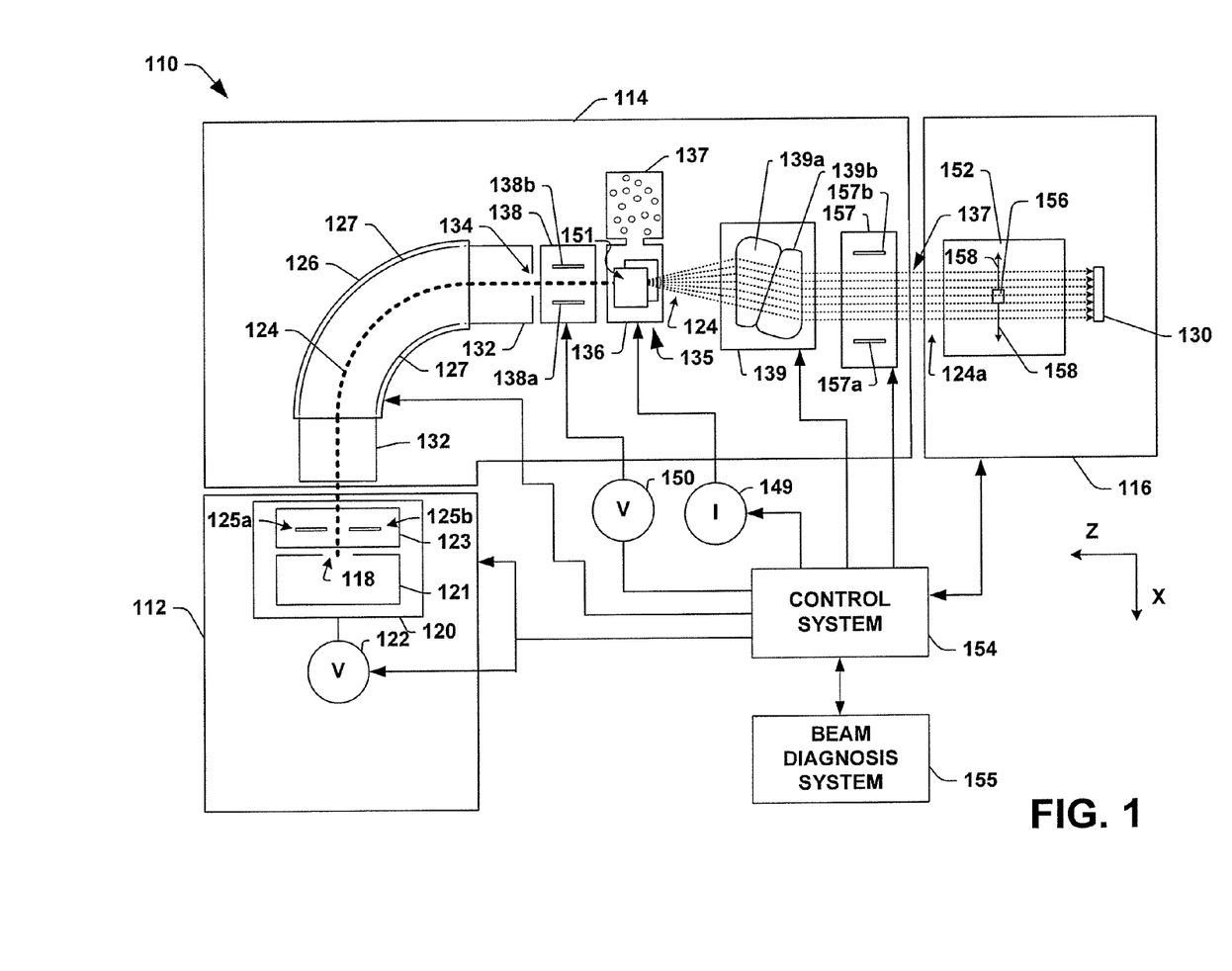
FIG. 1 is schematic a block diagram illustrating an exemplary ion implanter.

FIG. 1 illustrates an exemplary ion implantation system 110 in accordance with an aspect of the present invention. The system 110 is presented for illustrative purposes and it is appreciated that aspects of the invention are not limited to the described ion implantation system and that other suitable ion implantation systems can also be employed.

The system 110 has a terminal 112, a beamline assembly 114, and an end station 116. The terminal 112 includes an ion source 120 powered by a high voltage power supply 122 that produces and directs an ion beam 124 to the beamline assembly 114. The ion source 120 generates ions that are extracted and formed into the ion beam 124, which is directed along a beam path in the beamline assembly 114 to the end station 116.

To generate the ions, a gas of a dopant material (not shown) to be ionized is located within a generation chamber 121 of the ion source 120. The dopant gas can, for example, be fed into the chamber 121 from a gas source (not shown). In addition to power supply 122, it will be appreciated that any number of suitable mechanisms (none of which are shown) can be used to excite free electrons within the ion generation chamber 121, such as RF or microwave excitation sources, electron beam injection sources, electromagnetic sources and/or a cathode which creates an arc discharge within the chamber, for example. The excited electrons collide with the dopant gas molecules and generate ions. Typically, positive ions are generated although the disclosure herein is applicable to systems wherein negative ions are generated as well.

The ions are controllably extracted through a slit 118 in the chamber 121 by an ion extraction assembly 123, in this example. The ion extraction assembly 123 comprises a plurality of extraction and/or suppression electrodes 125. The extraction assembly 123 can include, for example, a separate extraction power supply (not shown) to bias the extraction and/or suppression electrodes 125 to accelerate the ions from the generation chamber 121. It can be appreciated that since the ion beam 124 comprises like charged particles, the beam may have a tendency to blow up or expand radially outwardly as the like charged particles repel one another. It can also be appreciated that beam blow up can be exacerbated in low energy, high current (high perveance) beams where many like charged particles (e.g., high current) are moving in the same direction relatively slowly (e.g., low energy) such that there is an abundance of repulsive forces among the particles. Accordingly, the extraction assembly 123 is generally configured so that the beam is extracted at a high energy so that the beam does not blow up. Moreover, the beam 124, in this example, is generally transferred at a relatively high energy throughout the system and is reduced just before the workpiece 130 to promote beam containment.

The beamline assembly 114 has a beamguide 132, a mass analyzer 126, a magnetic scanning system 135, and a parallelizer 139. The mass analyzer 126, in this example, is formed at about a ninety degree angle and comprises one or more magnets (not shown) that serve to establish a (dipole) magnetic field therein. As the beam 124 enters the mass analyzer 126, it is correspondingly bent by the magnetic field such that ions of an inappropriate charge-to-mass ratio are rejected. More particularly, ions having too great or too small a charge-to-mass ratio are deflected into side walls 127 of the beamguide 132. In this manner, the mass analyzer 126 merely allows those ions in the beam 124 which have the desired charge-to-mass ratio to pass there-through and exit through a resolving aperture 134. It will be appreciated that ion beam collisions with other particles in the system 110 can degrade beam integrity. Accordingly, one or more pumps (not shown) may be included to evacuate, at least, the beamguide 132 and extraction assembly 123.

The magnetic scanning system 135 in the illustrated example includes a magnetic scanning element 136 and a magnetic or electrostatic focusing and/or steering element 138. Respective power supplies 149, 150 are operatively coupled to the magnetic scanning element 136 and the focusing and steering element 138, and more particularly to respective pole pieces 136a, 136b and electrodes 138a, 138b located therein. The focusing and steering element 138 receives the mass analyzed ion beam 124 having a relatively narrow profile (e.g., a "pencil" beam in the illustrated system 110). A voltage applied by the power supply 150 to the plates 138a and 138b operates to focus and steer the beam to the scan vertex 151 of the scanning element 136. A current waveform applied by the power supply 149 to coils surrounding the pole pieces 136a and 136b form a time varying magnetic field that then scans the beam 124 back and forth, in this example. It will be appreciated that the scan vertex 151 can be defined as the point in the optical path from which each beamlet or scanned part of the ribbon beam appears to originate after having been scanned by the magnetic scanning element 136.

As previously described, magnetic based scanning of ion beams may result in the zero field effect (ZFE), an anomalous transport phase that occurs when the magnetic field in the scanning magnet has zero or close to zero amplitude. There may be at least two effects occurring close to zero magnetic field: below a field value necessary to confine free beam electrons, electrons from the outside of the scanner can flow freely into the scanner volume and promote neutralization of the ion beam. An increasing magnetic field may also energize these electrons through a cyclotron resonance mechanism such that electrons gain energy and are swept out of the scanner volume. The ZFE can result in an irregular flux profile of the scanned ribbon beam formed by the beams 124 wherein the current density is temporarily increased or decreased when the magnetic field of the scanning magnet has a zero or close to zero amplitude.

However, the present invention reduces the effect of ZFE by introducing an injected gas into the beam line to affect the ion beam in the region of the magnetic scanner. In one embodiment, the injected gas is introduced by a gas distribution element 137 at an inlet connected to the magnetic scanning element 136 causing the injected gas to be deployed throughout the magnetic scanner. In alternative embodiments, the injected gas may be introduced at an alternative location along the beam line (e.g., in the mass analyzer) which causes a change in the pressure of the gas in the magnetic scanner. In general, the gas may be introduced at any location along the beam line, so long as the magnetic scanner receives a sufficient amount of gas to enhance the magnetized beam current or density (e.g., to enhance the magnetized beam neutralization) and accordingly, the effect of ZFE.

Furthermore, the injected gas may comprise any gas which promotes neutralization. However, practical considerations may make certain gases more desirable. For example, some gases may be avoided if they have a chemistry which can be detrimental to the hardware of the workpiece (e.g., if the gases are reactive, or if the gases may form a residue on the workpiece). In one particular example, the injected gas may comprise an inert gas such as Argon or Xenon.

The gas distribution element 137 may comprise a source of gas and a mass flow controller (not separately shown) or functionally equivalent device (e.g., pressure controller, leak value, etc.). The mass flow controller can be configured to measure and control a specific type of gas, from the source of gas, and deliver it to the inlet over a particular range of flow rates. The mass flow controller can therefore control the pressure of the injected gas within the magnetic scanner such that the ion beam and the injected gas interact to affect the neutralization of the ion beam.

The scanned beam 124 is then passed through the parallelizer/corrector 139, which comprises two dipole magnets 139a, 139b in the illustrated example. The dipoles are substantially trapezoidal and are oriented to mirror one another to cause the beam 124 to bend into a substantially s shape. Stated another way, the dipoles have equal angles and radii and opposite directions of curvature.

The parallelizer 139 causes the scanned beam 124 to alter its path such that the beam 124 travels parallel to a beam axis regardless of the scan angle. As a result, the implantation angle is relatively uniform across the workpiece 130.

One or more deceleration stages 157 are located downstream of the parallelization component 139 in this example. Up to this point in the system 110, the beam 124 is generally transported at a relatively high energy level to mitigate the propensity for beam blow up, which can be particularly high where beam density is elevated such as at the resolving aperture 134, for example. The deceleration stage 157 comprises one or more electrodes 157a, 157b operable to decelerate the beam 124. The electrodes 157 are typically apertures through which the beam travels and may be drawn as straight lines in FIG. 1.

Nevertheless, it will be appreciated that while two electrodes, 125a and 125b, 138a and 138b and 157a and 157b, are respectively illustrated in the exemplary ion extraction assembly 123, focusing and steering element 138 and deceleration stage 157, that these elements 123, 138 and 157 may comprise any suitable number of electrodes arranged and biased to accelerate and/or decelerate ions, as well as to focus, bend, deflect, converge, diverge, scan, parallelize and/or decontaminate the ion beam 124 such as provided in U.S. Pat. No. 6,777,696 to Rathmell et al. the entirety of which is hereby incorporated herein by reference. Additionally, the focusing and steering element 138 may comprise electrostatic deflection plates (e.g., one or more pairs thereof), as well as an Einzel lens, quadrupoles and/or other focusing elements to focus the ion beam.

The end station 116 then receives the ion beam 124 which is directed toward a workpiece 130. It is appreciated that different types of end stations 116 may be employed in the implanter 110. For example, a "batch" type end station can simultaneously support multiple workpieces 130 on a rotating support structure, wherein the workpieces 130 are rotated through the path of the ion beam until all the workpieces 130 are completely implanted. A "serial" type end station, on the other hand, supports a single workpiece 130 along the beam path for implantation, wherein multiple workpieces 130 are implanted one at a time in serial fashion, with each workpiece 130 being completely implanted before implantation of the next workpiece 130 begins. In hybrid systems the workpiece 130 may be mechanically translated in a first (Y or slow scan) direction while the beam is scanned in a second (X or fast scan) direction to impart the beam 124 over the entire workpiece 130.

The end station 116 in the illustrated example is a "serial" type end station that supports the single workpiece 130 along the beam path for implantation. A dosimetry system 152 is included in the end station 116 near the workpiece location for calibration measurements prior to implantation operations. During calibration, the beam 124 passes through dosimetry system 152. The dosimetry system 152 may comprise a measurement element configured to measure a beam current or density of the ion beam. In embodiment the measurement element may include a faraday cup. In an alternative embodiment, the measurement element may comprise one or more profilers 156 that may continuously traverse a profiler path 158, thereby measuring the profile of the scanned beams.

The profiler 156, in this example, may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam. The dosimetry system, in one example, measures both beam density distribution and angular distribution.

A control system 154 is present that can control, communicate with and/or adjust the ion source 120, the mass analyzer 127, the magnetic scanning element 136, the parallelizer 139, the gas distribution element 137, and the dosimetry system 152. The control system 154 may comprise a computer, microprocessor, etc., and may be operable to take measurement values of beam characteristics (e.g., the beam current or density) and adjust parameters (e.g., injected gas flow rate, magnetic scanner element pressure) accordingly. The control system 154 can be coupled to the terminal 112 from which the beam of ions is generated, as well as the mass analyzer 126 of the beamline assembly 114, the magnetic scanning element 136 (e.g., via power supply 149), the focusing and steering element 138 (e.g., via power supply 150), the parallelizer 139, the gas distribution element 155, and the deceleration stage 157. Accordingly, any of these elements can be adjusted by the control system 154 to facilitate desired ion beam properties. For example, the energy level of the beam can be adapted to adjust junction depths by adjusting the bias applied to electrodes in the ion extraction assembly 123 and the deceleration stage 157, for example. The strength and orientation of magnetic field generated in the mass analyzer 126 can be adjusted, such as by regulating the amount of electrical current running through field windings therein to alter the curvature of the path of the desired ion beam, for example. The angle of implantation can be further controlled by adjusting the voltage applied to the steering element 138, for example.

In one particular embodiment, a beam diagnosis system 155 connected to the controller system is configured to vary the amount of injected gas introduced, via a gas distribution element 137, into the ion implantation system in response to the measured beam current or density. In one embodiment, the beam diagnosis system may be configured to incrementally add injected gas to the beam line to affect the ion beam in the magnetic scanning system 135. For example, if a beam current or density is measured which indicates a ZFE is present then the beam diagnosis system 155 will communicate to the gas distribution system 137 to introduce more injected gas into the beam line in response. The addition of more injected gas will change (e.g., enhance) the beam current or density in regions where a non-zero magnetic field is acting upon the ion beam (e.g., the ribbon beam) by changing beam neutralization. The change in beam current or density will result in a larger overall beam current or density over the wafer and a mitigation of ZFE. In one embodiment, the beam diagnosis system may be coupled to the controller system. In an alternative embodiment, the beam diagnosis system may be comprised within the controller system.

Therefore, the beam diagnosis system 155 and the control system 154 allow for an iterative method of ion beam tuning by which the magnetic beam current or density is tuned, through the iterative incremental addition of small amounts of injected gas to the beam line to affect a beam passing through the magnetic scanner and to remove the effects of ZFE.

Figure 2A:
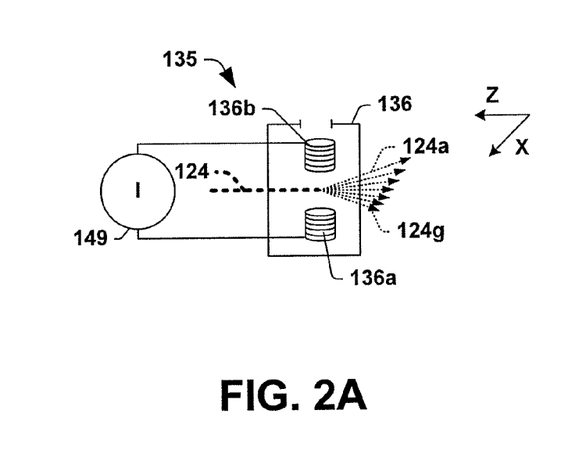
FIG. 2A is one embodiment of the scanner of FIG. 1 and several scanned ion beams.

A more detailed embodiment of the magnetic scanning system 135 is illustrated in FIG. 2A. The magnetic scanning system 135 shown in FIG. 2A comprises a scanner region having a first magnetic pole 136a and a second magnetic pole 136b on either lateral side of the beam path 124. The poles are separated by a gap comprising a vacuum, through which the beam path 124 runs. In one embodiment, the magnetic poles, 136a and 136b, may comprise electromagnetic coils.

Figure 2B:
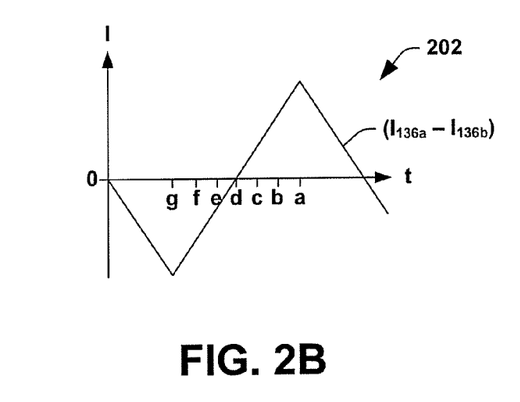
FIG. 2B is one embodiment of a triangular scanning coil voltage waveform in the scanner of FIG. 2A.
Figure 2C:
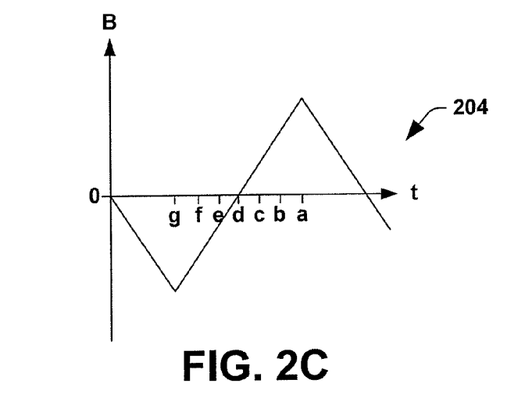
FIG. 2C is one embodiment of a resultant magnetic field waveform in the scanner of FIG. 2A due to the voltage waveform of FIG. 2B.

The magnetic poles may be coupled to a current source 149, configured to provide alternating currents to the magnetic poles 136a and 136b, as illustrated in a waveform diagram 202 in FIG. 2B. The time varying current between the magnetic poles forms a time varying magnetic field 204, as illustrated in a waveform diagram in FIG. 2C, extending outward from the coils across the beam path, by which the beam 124 is bent or deflected (e.g., scanned) along a scan direction (e.g., the X direction in FIGS. 2A and 2D). When the scanner magnetic field is in the direction from the pole 136a to the pole 136b, the ions of the beam 124 are subjected to a lateral force in the positive X direction (e.g., according to Lorentz' force equation F=q (v×B). When the poles 136a and 136b are subjected to zero current there is zero magnetic field in the scanner 136 (e.g., such as at time "d" in FIG. 1C) and the beam 124 passes through the scanner 136 unmodified. When the field is in the direction from the pole 136b to the pole 136a (e.g., times "a" and "c" in FIG. 1C), the ions of the beam 124 are subjected to a lateral force in the negative X direction).

Figure 2D:
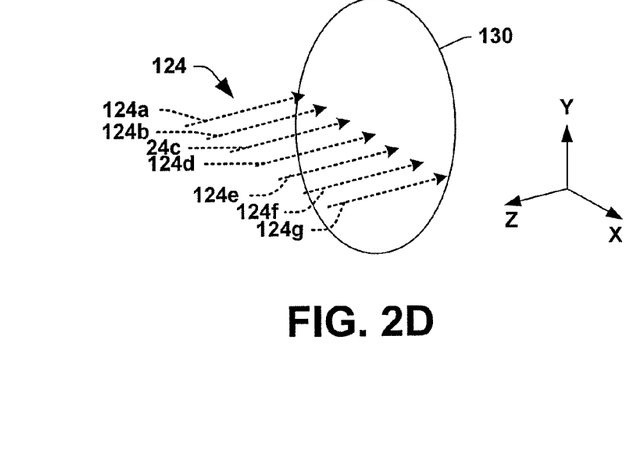
FIG. 2D is a perspective view illustrating one scanned ion beam striking a workpiece in the system of FIG. 2A at several discrete points in time.

FIG. 2A shows the scanned beam 124 deflection as it passes through the magnetic scanning element 136 at several discrete points in time during scanning prior to entering the parallelizer 138. FIG. 2D illustrates the scanned and parallelized beam 124 impacting the workpiece 130 at the corresponding times indicated in FIGS. 2B-2C. When the current through the poles is at a maximum and minimum (e.g., a negative maximum) the corresponding magnetic field strength will be at a maximum and minimum (e.g., a negative maximum) so that the beam can be found at the extremes of the beam path (e.g., at the far right and the far left edges of the workpiece 130). The beam 24b-24g is illustrated in FIG. 2D for scan currents at corresponding times "b"-"g" of FIG. 2B for a single generally horizontal scan across the workpiece 130 in the X direction.

Figure 3:
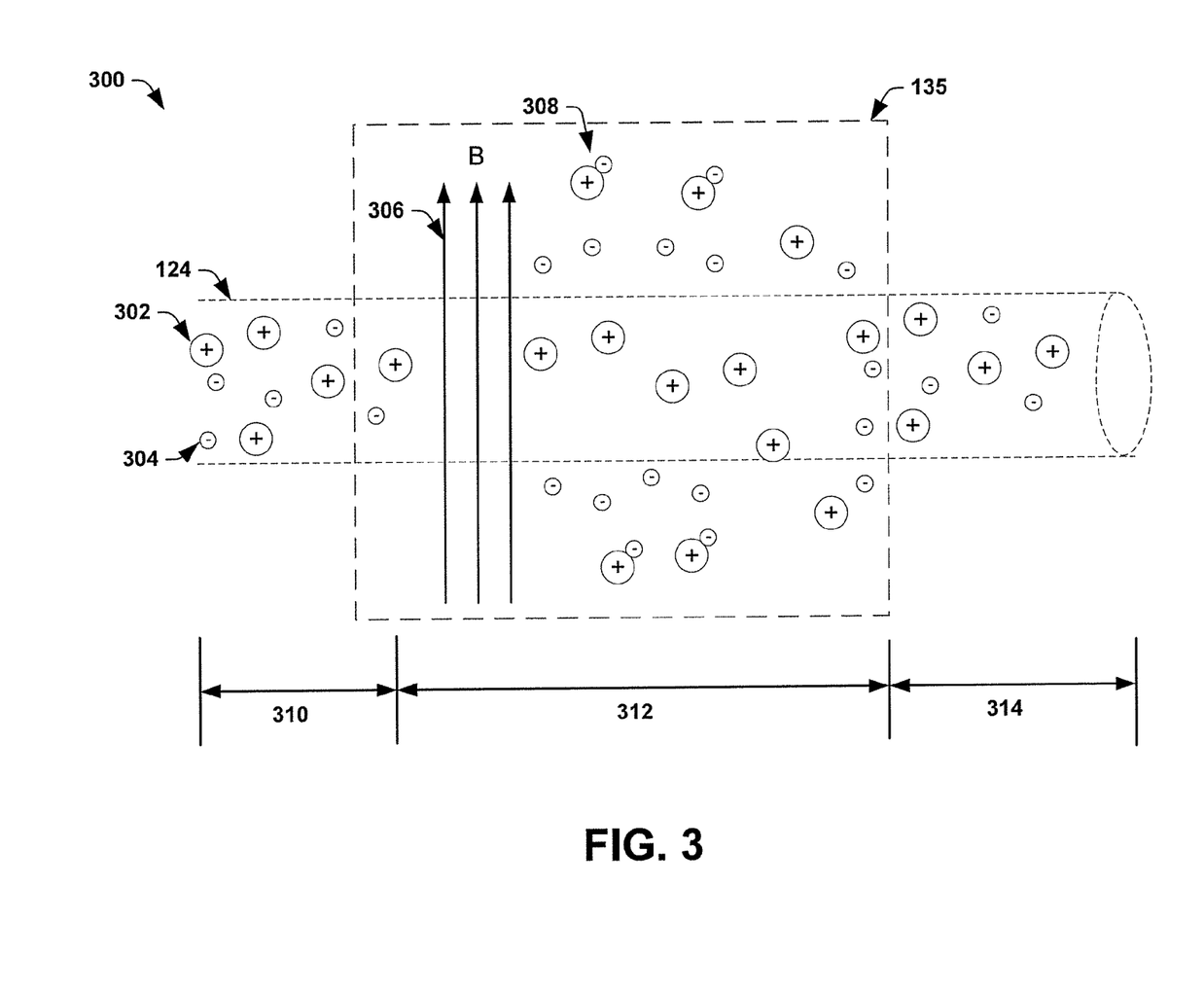
FIG. 3 illustrates a more detailed embodiment of an ion beam passing through a magnetic beam scanning element and surrounding elements.

FIG. 3 illustrates a more detailed embodiment of an ion beam 124 passing through a magnetic scanner system 135. As shown in FIG. 3, upstream of the magnetic scanning element 136 (e.g., when the beam line is passing through the mass analyzer), in region 310, the ion beam 124 may be neutralized by negative neutralizing particles in the beam line resulting in a neutralized beam comprising a mixture of positive ions 302 and negative electrons 304. Since there is substantially no magnetic or electric field in the beam line, the ion beam 124 can maintain a mixture of positive ions 302 and negative neutralizing electrons 304 as it proceeds down the beam line, thereby resulting in a neutral ion beam.

As the ion beam passes through a magnetic field 306 (e.g., produced by the magnetic scanner), in scanner region 312, the neutralizing electrons 304 are prevented from entering the scanner region 312 by the transverse magnetic field, and/or forced out of the scanner region 312 (e.g., by the magnetic field or by an induced electric field formed by the time varying magnetic field), resulting in the ion beam comprising predominantly positive ions and thereby causing charge neutralization in the scanner region 312 to break down.

However, the injected gas 308 reduces the changes in neutralization caused by the magnetic field 306. More particularly, the injected gas 308, added in the magnetic scanning system 135, causes a large increase in neutralization by providing collisions. These collisions may increase the number of neutralizing electrons 304 in the beam area (e.g., by ionizing collisions with the injected gas creating new ion-electron pairs) and/or may increase the residence time of neutralizing electrons 304 in the beam area due to collisions with the gas, thereby affecting the ion beam transport (e.g., enhancing the magnetized beam transport). Therefore, beam current or density over the entire surface of the workpiece is enhanced (e.g., increased) so that the effect of the ZFE is minimized.

Accordingly, by enhancing (e.g., increasing) the beam current or density, the invention both decreases the effect of the zero field anomaly and improves productivity by providing more overall scanned current.

Figure 4:
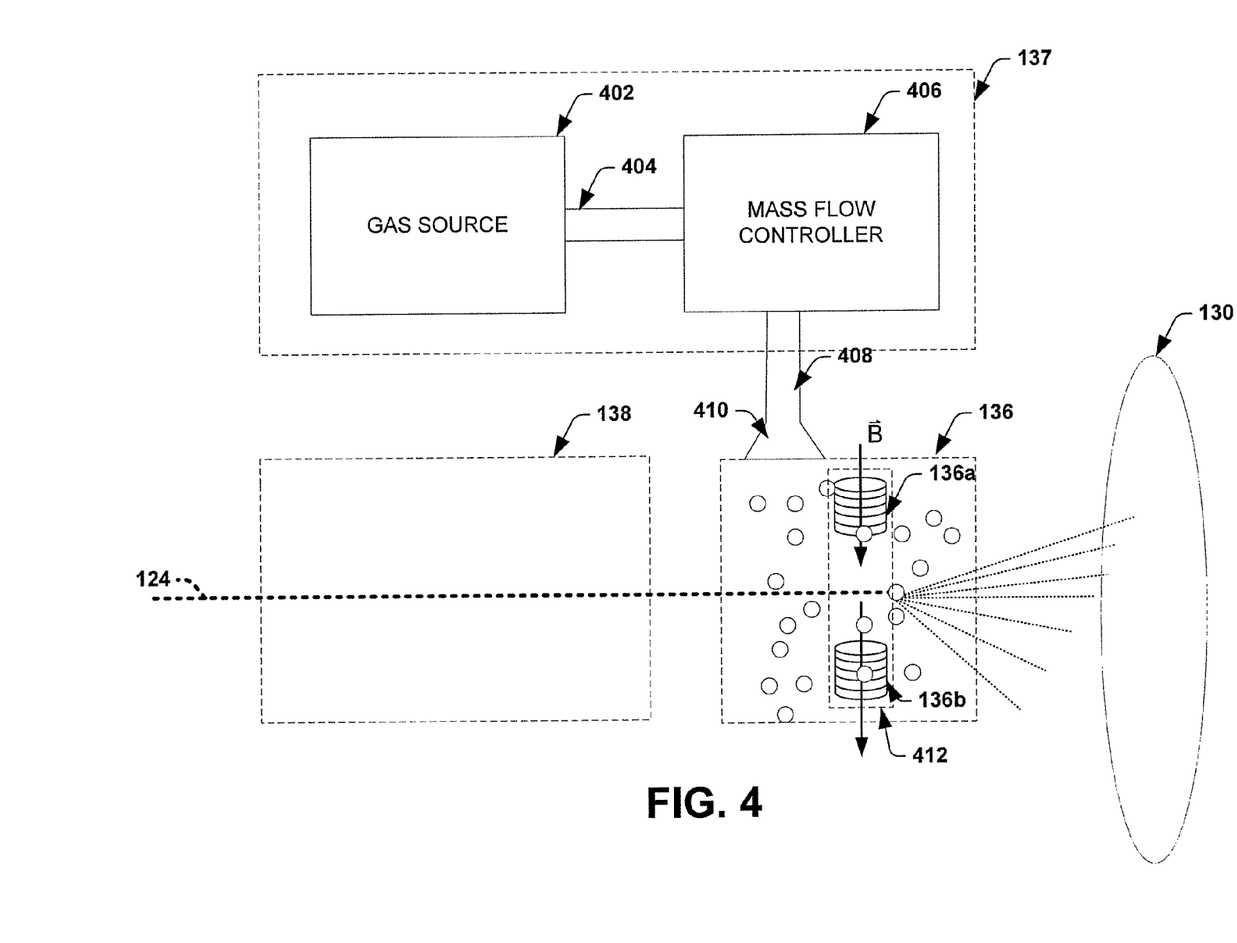
FIG. 4 illustrates one embodiment of a system configured to provide an injected gas to a magnetic scanning element.

FIG. 4 illustrates a more detailed embodiment of a magnetic scanning element as provided herein. As illustrated in FIG. 4, a gas source 402 is connected to a mass flow controller 406 or functionally equivalent device (e.g., pressure controller, leak value, etc.) by conduit 404. The mass flow controller 406 is further connected, by conduit 408, to an inlet 410 which is configured to provide the injected gas to the beam line. In one embodiment, shown in FIG. 4, the inlet 410 is configured to provide the injected gas directly to the magnetic scanning element 136. In an alternative embodiment, an inlet may be configured to provide the injected gas at an alternative location in the ion implantation system to primarily affect the ion beam passing through the magnetic scanning element.

The magnetic scanning element 136 may comprise a scanner region 412 having an in-vac scanner, wherein a first magnetic pole 136a and a second magnetic pole 136b are configured within a vacuum on either lateral side of the beam path 124. Alternatively, magnetic scanning element 136 may comprise a scanner region 412 having an in-air scanner, wherein a first magnetic pole 136a and a second magnetic pole 136b configured outside of the vacuum to surround a beam guide.

Figure 5A:
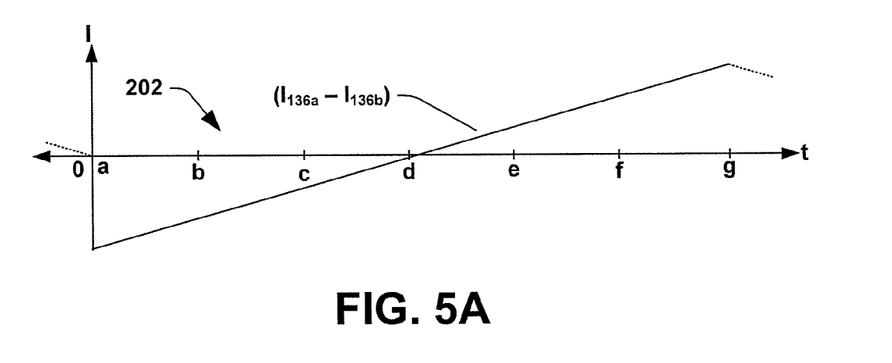
FIGS. 5A-5E illustrate charts describing aspects of the method for introducing a gas into the scanner region of an ion implanter as provided herein.
Figure 5B:
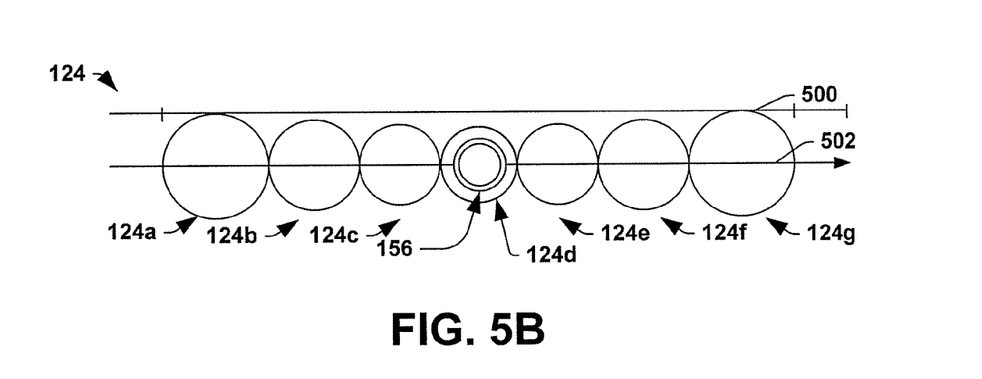

Referring now to FIG. 5A-5E. In FIG. 5B a cross-sectional view of aspects of the dosimetry system 152 of FIG. 1 is shown cut along a 2-dimensional cross section for an ion implantation system having a magnetic scanner region comprising no injected gas. As shown, the beam traverses the scan path 502, which is carved out by the beam as it is scanned and which has an associated scan path width 500. FIG. 5B shows several exemplary cross sections of the scanned ion beams over the scan path 502 (e.g., 124a, 124b, 124c, 124d, 124e, 124f, and 124g, as well as several intermediate scanned beams, i.e., dashed circles, that could occur between 124c and 124e) correlating to the current waveform in FIG. 5A. For example, in FIG. 5A a relatively large negative current is applied on the poles at time "a", which corresponds to scanned ion beam 124a at the left portion of the scan path 502. Similarly, a substantially zero current is applied to the plates at time "d", which corresponds to scanned ion beam 124d, at the center portion of scan path 502.

FIG. 5B further illustrates the beam size as the beam traverses the beam path. As illustrated in FIG. 5B, the beam may change in size as it traverses the beam path due to ion beam blow up. For example, as the beam moves away from the center position of the scan path 502 the size of the beam may increase since the magnetic field at time "a" may cause the beam neutralization to break down resulting in beam blow up. This results in the ion beam 124a located away from the center portion of the scan path 502 having a larger size than the ion beam 124d located at the center portion of the scan path 502.

Figure 5C:
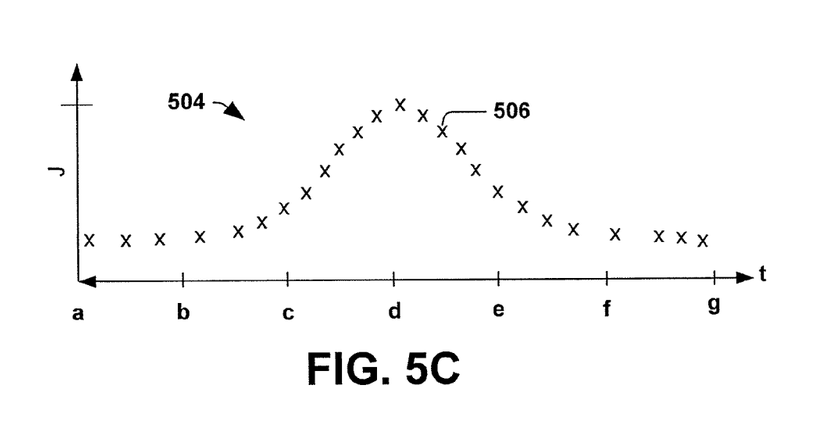

As the beam 124 is scanned across the scan path 502, portions of the beam 124 may pass through the profiler 156. FIG. 5C, illustrates a current density (J) distribution in the form of a beam current signal 504 represented by a series of discrete measurement points (e.g., 506) for a single profiling sweep. The current density of the beam current signal 504 the current density undergoes a decrease in the region (e.g., at x='d') where the magnetic field is equal to substantially zero and increases in regions where the magnetic field is non-zero (e.g., at x='a' or x='g'). As one of skill in the art will appreciate, the illustrated current density of the beam current signal 504 does not in any way limit the scope of the present invention as various beams may be characterized by different beam current signals. For example, the methods and apparatus for improving productivity and uniformity of a magnetically scanned ion beam will apply regardless of the trends of the profiles (e.g., if the scanned ribbon flux is increased or decreased in regions of zero magnetic field).

Figure 5D:
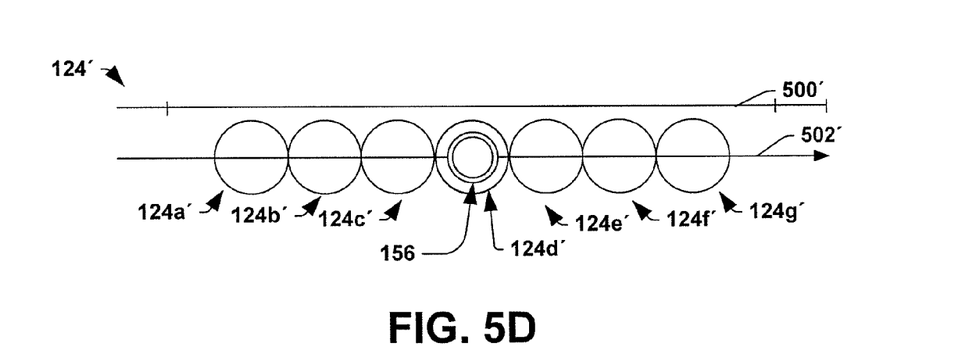
Figure 5E:
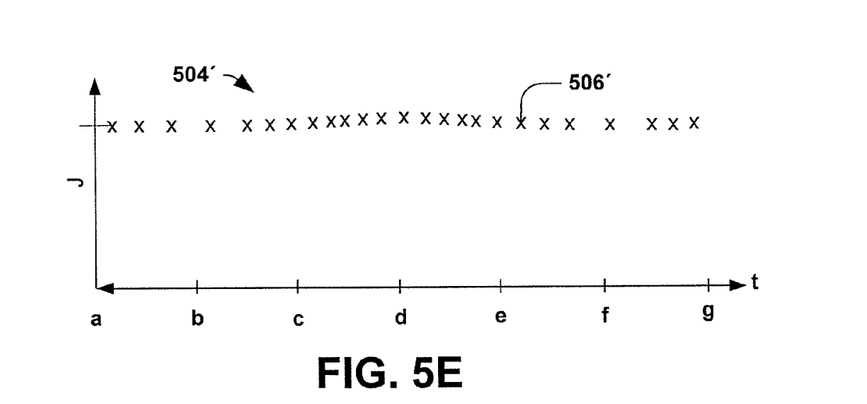

In contrast to FIG. 5B, FIG. 5D illustrates a cross-sectional view of aspects of the dosimetry system 152 cut along a 2-dimensional cross section for a magnetic scanner region having an injected gas, wherein the scanned ion beams correlate to the waveform in FIG. 5A. As shown in FIG. 5D, the beam size remains substantially uniform as the beam traverses the beam path (e.g., in comparison to the beam size of FIG. 5B) since the injected gas reduces the beam neutralization of the magnetized beam (e.g., at time "a") resulting in reduced beam blow up. This results in a current density of the beam current signal 504 that is substantially uniform between the regions where the magnetic field is equal to substantially zero (e.g., at x='d') and regions where the magnetic field is non-zero (e.g., at x='a' or x='g').

Figure 6A:
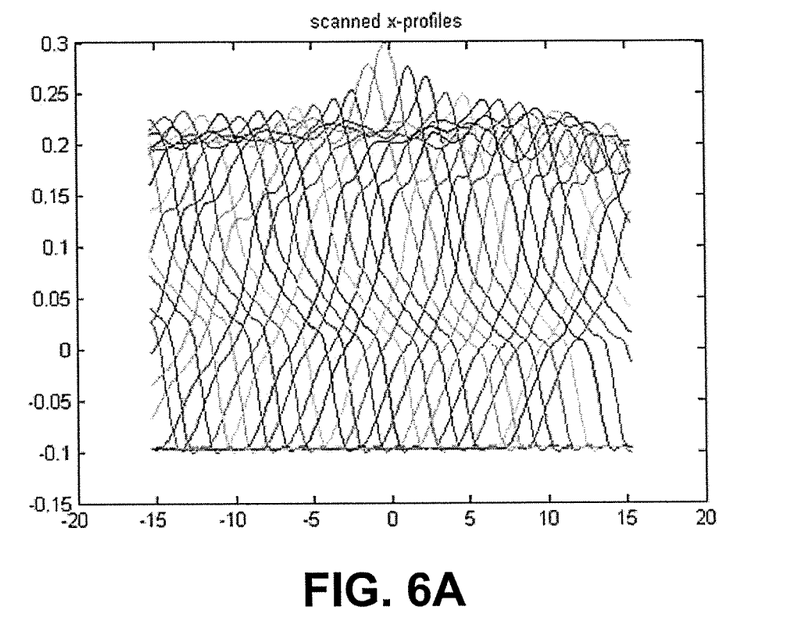
FIGS. 6A-6B illustrate a set of dynamic pencil beam profiles for a given scanned beam across a scan width produced by traveling profiler.
Figure 6B:
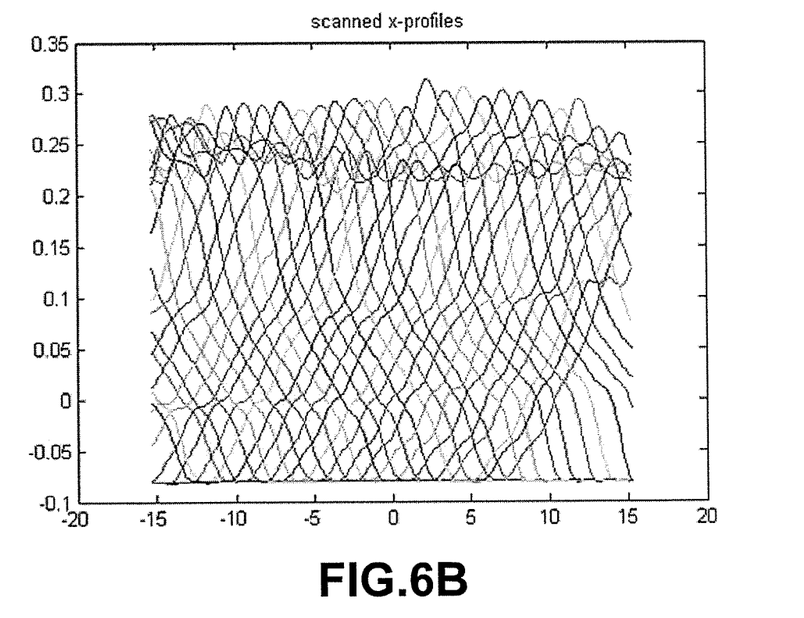

FIGS. 6A-6B illustrates a set 600 of dynamic pencil beam profiles for a given scanned beam across a scan width produced by traveling profiler, wherein the x-axis is scan distance and the y-axis is beam current density in arbitrary units. Respective profiles have a center that moves along the x-axis with a fixed scan velocity. The x-axis moves from −15 cm to 15 cm, over the width of a typical 300 mm workpiece. The position x=0 in the plot is the center of the scan where the scanning magnetic field is equal to zero. Respective lines are representative of a pencil beam being scanned from left to right frozen in time (pencil beam at one instance in time across the width).

In particular, FIG. 6A illustrates a set of dynamic pencil beam profiles in a magnetic scanner without an injected gas. As illustrated in FIG. 6A, without an injected gas a pencil beam comprises a peak value at its center (e.g., around 0.4). However, the magnetized beams (e.g., beams that are not at x=0 or beams that are subject to a non-zero magnetic field) have a lower peak value, thereby causing a ZFE that is easily discernable for the pencil beam 602 at x=0. This is because pencil beams lose beam current due to neutralization changing as a magnetic field is applied. Therefore, the only beam profile shown that is not subjected a magnetic field is the beam profile, 602, (e.g., in the middle) having the largest beam current, while all other beam profiles, having smaller beam currents, are subjected to a magnetic field.

FIG. 6B illustrates a set of dynamic pencil beam profiles in a magnetic scanner comprising an injected gas. As illustrated in FIG. 6B, with an injected gas comprised within the magnetic scanner region all the beams have similar peak values (e.g., close to 0.4). Therefore, by introducing an injected gas, the ZFE is not removed, but instead neutralization of ion beams that are off center (e.g., magnetized beams) is enhanced. As is evident in FIG. 6B, the effect of the injected gas on the non-magnetized beam is small (e.g., causing a small increase in beam current), while the effect of the injected gas on the magnetized beam current is larger, (e.g., causing a larger increase in the beam current) thereby resulting in an even profile of beam currents.

Furthermore, in the traces of FIG. 6B, at one given period of time, the pencil beam profiles of magnetized beams occupy a large fraction of the scan period, resulting in an overall beam current enhancement due to improved neutralization. This results in an overall improved productivity of the beam current in addition to the effective removal of ZFE.

Figure 7:
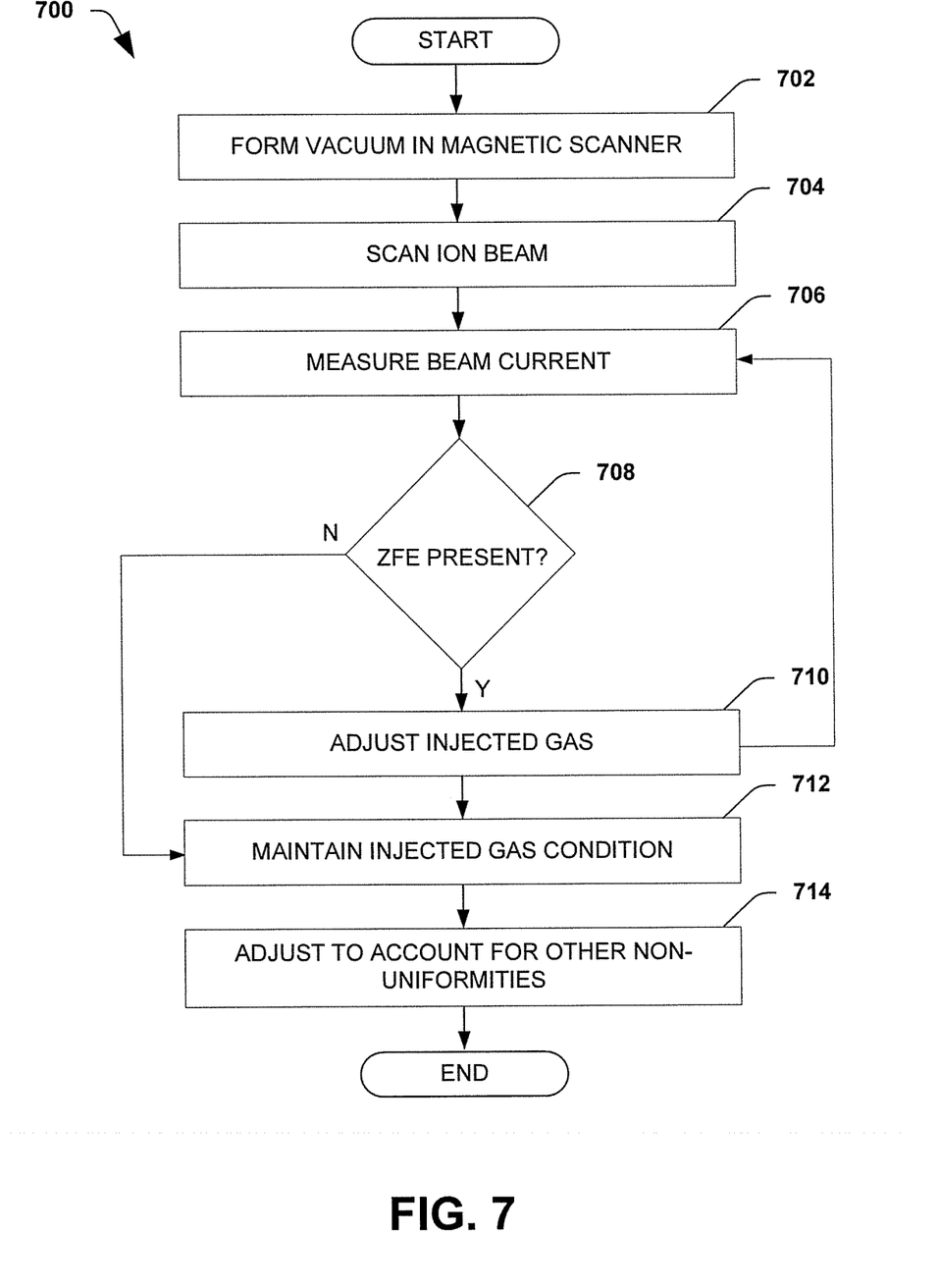
FIG. 7 illustrates a flow diagram of a method for introducing a gas into the scanner region of an ion implanter to improve productivity and uniformity of a magnetically scanned ribbon beam.

FIG. 7 illustrates an exemplary method 700 for optimizing an injected gas in a magnetic scanner. The method iteratively adjusts the amount of gas in a magnetic scanner until an optimum gas flow is achieved to provide a beam current across the surface of a wafer which is sufficiently high to remove the effect of ZFE. More particularly, a beam current is measured to determine a ZFE and to iteratively tune the manner in which the injected gas is incrementally introduced to optimize beam neutralization of a magnetic ion beam and to reduce the effect of ZFE on the ion beam.

At 702 a vacuum is provided in the beam line of the ion implantation system. High vacuum pumps evacuate the beamline and process chamber to extremely low pressures (e.g., $<10^{-6}$ Torr), until only a small amount of residual gas remains. However, the extent of ion beam neutralization resulting from this beam/injected gas interaction may be insufficient to support beam neutralization in the presence of a magnetic field.

At 704 the ion beam is scanned across a scan path. The scan path is the path that the ion beam (e.g., a pencil beam) will traverse as it is moved by the force of a varying magnetic field, produced by a magnetic scanning system comprising two magnetic poles (e.g., electromagnetic coils), resulting in a ribbon beam. In one embodiment, the scan path may extend across the width of a targeted workpiece. The ion beam may be scanned over the scan path at a scan rate that is dependent upon the time dependence of the magnetic field (e.g., as the magnetic field changes the position of the ion beam on the scan path changes).

A beam current and/or density is measured at 706. The beam current of the ribbon beam can then be measured over a scan path. In one embodiment the beam current may be measured using a faraday cup. A faraday cup is a conductive cup that may be configured in proximity to the workpiece to capture charged particles from the ion beam. When particles from the ion beam hit the conductive cup, it gains a small net charge while the ions are neutralized. The cup can then be discharged to provide a small current, equivalent to the number of impinging ions, to an attached circuit. By measuring the small current, the beam current of the ion beam can be determined. The faraday cup, therefore provides the beam current as a function of time.

In an alternative embodiment, the beam current can be measured using one or more profilers configured to measure the beam current across the width of the ribbon beam. The profilers may continuously traverse a profiler path (e.g., across the width of a workpiece), thereby measuring the profile of scanned ion beams. In one embodiment a profiler may comprise a moving faraday cup.

Zero field anomalies (i.e., zero field effects (ZFE)) are identified at 708. A ZFE may be determined in a measured beam current as a local decrease or bump in the measured beam current at a location where the magnetic field is zero. The bump may comprise a change in the measured beam current that is greater than a certain threshold value. In other words, a ZFE is characterized as a change in the measured beam current (e.g., a dipping in the measured beam current) at a location where the magnetic field is zero.

If a ZFE is detected then injected gas is adjusted in response at 710. The adjustment may comprise comparing the beam current and density at multiple scan positions and adjusting the gas pressure to minimize the difference between these beams measured at multiple scan positions. In other words, the adjustment of injected gas raises the pressure of an ambient vacuum thereby enhancing the beam current in regions where a non-zero magnetic field is acting upon the ion beam (e.g., the magnetic ion beam) by increasing the change in neutralization. The increase in beam current of the magnetic ion beam will result in a larger overall beam current over the wafer thereby mitigating the effect of the ZFE at locations where the magnetic field is zero.

It will be appreciated that the pressure in the scanner is combination of the gas injection rate and the amount of high vacuum pumping performed on the system. This allows the pressure to be varied by either changing the amount of injected gas and/or changing the amount of high vacuum pumping (e.g., changing the pumping rate of the pump, or changing the conductance with a variable opening valve).

Actions 702-710 may be iteratively performed in a manner which tunes the beam current by an incremental addition of injected gas. It will be appreciated that the amount of injected gas added during respective iterations may be small, thereby increasing the beam current in a gradual manner. After respective adjustments of the injected gas, the beam current can be re-measured and if a ZFE is still measured then the injected gas may be iteratively readjusted (e.g., incrementally added) until a satisfactory reading is achieved.

Introduction of the incremental addition of injected gas may be completed when the beam current reaches a desired uniformity. It will be appreciated that although the beam current will typically increase due to the increased amount of gas in the magnetic scanning element, that the beam current may also decrease due to the additional injected gas (e.g., if too much injected gas is added to the magnetic scanning element). Therefore, as provided herein, injected gas may be added until a desired uniformity of beam current is achieved. In various, non-limiting embodiments, during the incremental introduction of an injected gas the beam current may increase (e.g., thereby increasing the beam current of the magnetized beam to effectively minimize the effect of ZFE) or decrease while remaining within the scope of the invention provided herein.

If a ZFE is not detected, the gas condition of the system is maintained at 712. If a ZFE is not detected it is indicative that a proper amount of gas has been added to the system to remove the effect of ZFE and there is no need to make further adjustments. Therefore, the gas condition is maintained to effectively minimize the effect of the ZFE. It will be appreciated that measurements may still be taken and in the event of a ZFE being detected the method 700 may be reinstated in response to the measured ZFE.

In an additional embodiment, once the effect of the ZFE has been removed, the beam may be further adjusted to account for other non-uniformities in the beam (e.g., due to the way the beam transports in general, due to optics, etc.) at 714. In one embodiment, the beam may be adjusted utilizing scanned waveform correction, wherein the scan speed of the ion beam is modulated or changed to reduce or increase the flux of the profile, as is known in the art. For example, a triangular waveform may be varied into a different shape to change the ion beam scan speed. It may be appreciated that increasing the uniformity of the beam profile, by removal of the ZFE, is advantageous to the subsequent uniformity correction since the ribbon beam uniformity is closer to the desired one.

Figure 8:
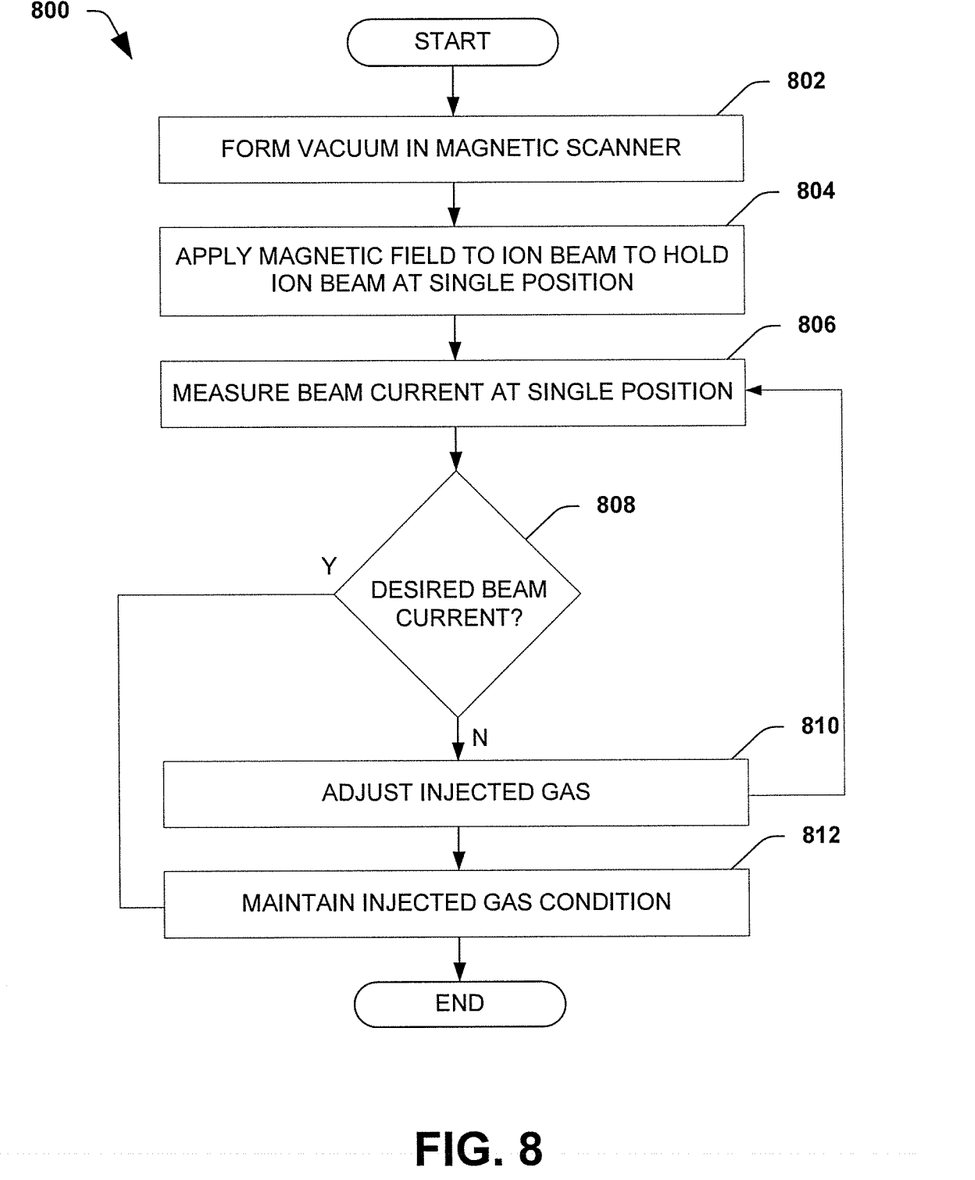
FIG. 8 illustrates an alternative exemplary method 800 for optimizing an injected gas in a magnetic scanner.

FIG. 8 illustrates an alternative exemplary method 800 for optimizing an injected gas in a magnetic scanner. In the method 800, the beam current and/or density is measured at a single position along the scan path. An injected gas can be introduced (e.g., an injected gas flow can be varied), in response to the measured beam current and/or density, to achieve some desired change in the beam current and/or density at this single position. It will be appreciated that such an embodiment may be used as a test or calibration method that can be run prior to production. Such an embodiment may allow for faster measurement times and improved performance of the tuning.

At 802 a vacuum is provided in the beam line of the ion implantation system.

A magnetic field is applied to the ion beam to hold the ion beam at a single position at 804. The magnetic field may cause the ion beam to move to a position off center due to the force of a magnetic field.

At 806 a beam current and/or density is measured. The beam current of the ion beam is measured at a single position along the scan path. In one embodiment the beam current may be measured using a faraday cup or using one or more profilers configured to measure the beam current. If the beam current does not achieve a predetermined desired value, the injected gas may be adjusted at 810. If the beam current achieves the predetermined desired value, the condition of the injected gas may be maintained.

The injected gas is adjusted at 810. Adjusting the injected gas may comprise tuning the injected gas flow for a desired beam current and/or density change or value based on some prior knowledge of what is required rather than directly measuring the differences in beam current and/or density. In other words, an injected gas can be introduced (e.g., an injected gas flow can be varied) to achieve some desired change in the beam current and/or density at this single position, resulting in a change in neutralization that affects the ion beam current in regions where a non-zero magnetic field is acting upon the ion beam (e.g., the magnetic ion beam) by increasing the change in neutralization. The increase in beam current of the magnetic ion beam will result in a larger overall beam current over the wafer thereby mitigating the effect of the ZFE at locations where the magnetic field is zero.

Actions 802-810 may be iteratively performed in a manner which tunes the beam current by an incremental addition of injected gas. After respective adjustments of the injected gas, the beam current can be re-measured and if a ZFE is still measured then the injected gas may be iteratively readjusted (e.g., incrementally added) until a satisfactory reading is achieved.

Although the invention has been shown and described with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion implantation system comprising:
   an ion source configured to generate an ion beam along a beam path, wherein the ion beam has a beam current or density;
   a mass analysis component downstream of the ion source configured to perform mass analysis on the ion beam;
   a magnetic scanning element located downstream of the ion source configured to produce a magnetic field which operates upon the ion beam;
   an inlet configured to introduce an injected neutral gas into the ion implantation system to primarily affect the magnetic scanning element, wherein the injected neutral gas affects the beam current or density of the ion beam subjected to the magnetic field; and
   an end station downstream of the magnetic scanning element and mass analysis component configured to receive the ion beam.

2. The ion implantation system of claim 1, further comprising:
   a dosimetry system that is configured to measure the beam current or density of the ion beam; and
   a beam diagnosis system configured to incrementally introduce the injected neutral gas into the ion implantation system according to the measured beam current or density.

3. The ion implantation system of claim 2, wherein the dosimetry system comprises a faraday cup proximate to the end station configured to measure the beam current or density of the ion beam.

4. The ion implantation system of claim 2, wherein the dosimetry system comprises a profiler including a current density sensor configured to move along a scan path.

5. The ion implantation system of claim 1, further comprising a controller connected to a gas source, wherein the controller is configured to control the flow of injected neutral gas from the gas source, and deliver the injected gas to the inlet over a particular range of flow rates.

6. The ion implantation system of claim 5, wherein the magnetic field comprises a variable magnetic field configured to scan the ion beam along a scan path.

7. The ion implantation system of claim 6, wherein the controller is configured to incrementally insert an amount of injected neutral gas into the magnetic scanning element region to minimize a change in a measured beam current between different positions along the scan path.

8. The ion implantation system of claim 7, wherein the injected neutral gas comprises Argon or Xenon.

9. The ion implantation system of claim 5, wherein the magnetic field is configured to substantially hold the ion beam at a single position.

10. The ion implantation system of claim 9, wherein the controller is configured to incrementally insert an amount of injected neutral gas into the magnetic scanning element region to achieve a desired change in a measured beam current or density of the ion beam at the single position.

11. The ion implantation system of claim 1, wherein the inlet is connected to the magnetic scanning element.

12. The ion implantation system of claim 1, wherein the injected neutral gas comprises an inert gas.

13. The ion implantation system of claim 1, wherein the injected neutral gas increases a gas pressure in the magnetic scanning element.

14. A magnetic scanner for an ion implantation system, comprising:
   a magnetic scanner region comprising a first magnetic pole and a second magnetic pole configured to produce a magnetic field in an ion beam path; and
   an inlet configured to introduce an injected neutral gas into the ion implantation system to raise a gas pressure in the ion beam path and to enhance a current of an ion beam subjected to the magnetic field thereby effectively minimizing a zero field effect on the ion beam.

15. The magnetic scanner of claim 14, wherein the ion beam comprises an ion pencil beam running along a beam path and having a trajectory that is modified into a ribbon beam as it passes through the magnetic field.

16. The magnetic scanner of claim 14, wherein the injected neutral gas comprises an inert gas.

17. The magnetic scanner of claim 14, wherein the injected neutral gas is inserted directly into the scanning region at an inlet.

18. The magnetic scanner of claim 14, further comprising a controller, connected to a gas source, configured to provide the injected neutral gas to the magnetic scanner region or a region proximate thereto, wherein the controller is configured to measure or control the injected neutral gas from the gas source, and deliver it to the inlet over a particular range of flow rates.

19. The magnetic scanner of claim 18, wherein the controller is configured to incrementally insert an amount of injected neutral gas into the magnetic scanner region or a region proximate thereto based upon a measured beam current or density.

20. The magnetic scanner of claim 18, wherein the controller is configured to incrementally insert an amount of injected neutral gas into the magnetic scanner region or a region proximate thereto to minimize a change in a measured beam current between different positions along the scan path.

21. The magnetic scanner of claim 14, wherein the magnetic field comprises a variable magnetic field configured to scan the ion beam along a scan path.

22. The magnetic scanner of claim 14, wherein the magnetic field is configured to substantially hold the ion beam at a single position.

23. The magnetic scanner of claim 22, wherein the controller is configured to incrementally insert an amount of injected neutral gas into the magnetic scanner region or a region proximate thereto to achieve a desired change in a measured beam current or density of the ion beam at the single position.

24. A method for improving uniformity of magnetically scanned ion beams in an ion implantation system, comprising:
   forming vacuum having a pressure in a magnetic scanning region of the ion implantation system;
   magnetically scanning an ion beam having a beam current or density across a scan path at a scan rate; and
   adding an injected neutral gas to the ion implantation system to provide a uniformity of the beam current of the magnetic ion beam over the scan path, thereby effectively mitigating a zero field effect,
   wherein the injected neutral gas is added according to a measured beam current signal resulting in an increase of the pressure in the magnetic scanning region.

25. The method of claim 24, further comprising measuring the beam current signal as the ion beam is scanned across the scan path.

26. The method of claim 25, wherein the beam current signal is measured by a faraday cup.

27. The method of claim 25, wherein the beam current signal is measured by a profiler configured to move along the scan path.

28. The method of claim 25, further comprising incrementally adding or adjusting the injected neutral gas based on the measured beam current signal until the zero field effect is no longer measured.

29. The method of claim 24, further comprising correcting for additional non-uniformities in the ion beam.

30. The method of claim 24, wherein the injected neutral gas comprises an inert gas.

31. The method of claim 30, wherein the injected neutral gas comprises Argon or Xenon.

32. The method of claim 24, wherein the injected neutral gas is added by a controller connected to a gas source, wherein the controller is configured to measure and control the injected neutral gas from the gas source, and deliver it to the magnetic scanning region or a region proximate thereto over a particular range of flow rates.

33. A method for improving uniformity of magnetically scanned ion beams in an ion implantation system, comprising:
   forming vacuum having a pressure in a magnetic scanning region of the ion implantation system;
   subjecting an ion beam having a beam current or density to a magnetic field forcing the ion beam to a substantially constant position; and
   adding an injected neutral gas to the ion implantation system to increase the beam current of the ion beam to a predetermined value configured to effectively mitigate a zero field effect, wherein the injected neutral gas is added according to a measured beam current signal resulting in an increase of the pressure in the magnetic scanning region.

34. The method of claim 33, wherein the beam current signal is measured by a faraday cup.

35. The method of claim 33, wherein the beam current signal is measured by a profiler configured to move along the scan path.

36. The method of claim 33, wherein the injected neutral gas comprises an inert gas.

37. The method of claim 36, wherein the injected neutral gas comprises Argon or Xenon.

38. The method of claim 33, wherein the injected neutral gas is added by a controller connected to a gas source, wherein the controller is configured to measure and control the injected neutral gas from the gas source, and deliver it to the magnetic scanning region or a region proximate thereto over a particular range of flow rates.

* * * * *